United States Patent [19]
Park

[11] Patent Number: 5,620,911
[45] Date of Patent: Apr. 15, 1997

[54] METHOD FOR FABRICATING A METAL FIELD EFFECT TRANSISTOR HAVING A RECESSED GATE

[75] Inventor: Sang H. Park, Kyoungki-do, Rep. of Korea

[73] Assignee: Hyundai Electronics Industries Co., Ltd., Kyoungki-do, Rep. of Korea

[21] Appl. No.: 365,293

[22] Filed: Dec. 28, 1994

[30] Foreign Application Priority Data

Dec. 31, 1993 [KR] Rep. of Korea ............... 93-31827
Dec. 31, 1993 [KR] Rep. of Korea ............... 93-31863
Dec. 31, 1993 [KR] Rep. of Korea ............... 93-31879
Dec. 31, 1993 [KR] Rep. of Korea ............... 93-31889

[51] Int. Cl.⁶ ............ H01L 21/265; H01L 21/44; H01L 21/255; H01L 21/302
[52] U.S. Cl. ............ 438/297; 438/298; 438/303; 438/307; 438/291
[58] Field of Search .......... 437/69, 40 RG, 437/41 RG, 44, 45, 29, 190, 160, 164, 203, 162

[56] References Cited

U.S. PATENT DOCUMENTS

| | | | |
|---|---|---|---|
| 4,271,421 | 6/1981 | McElroy | 357/41 |
| 4,685,196 | 8/1987 | Lee | 437/41 RG |
| 4,939,100 | 7/1990 | Jeuch et al. | 437/203 |
| 5,108,937 | 4/1992 | Tsai et al. | 437/69 |
| 5,169,796 | 12/1992 | Murray et al. | 437/44 |
| 5,198,378 | 3/1993 | Rodder et al. | 437/41 |
| 5,248,893 | 9/1993 | Sakamoto | 257/409 |
| 5,342,796 | 8/1994 | Ahn et al. | 437/29 |
| 5,434,440 | 7/1995 | Yoshitomi et al. | 257/344 |
| 5,448,094 | 9/1995 | Hsu | 437/44 |

FOREIGN PATENT DOCUMENTS

| | | | |
|---|---|---|---|
| 62-296472 | 12/1987 | Japan | 437/40 RG |
| 6-112309A | 4/1994 | Japan | 437/41 RG |

*Primary Examiner*—Mary Wilczewski
*Assistant Examiner*—Brian K. Dutton
*Attorney, Agent, or Firm*—Morgan & Finnegan, L.L.P.

[57] ABSTRACT

A method for fabricating a metal oxide semiconductor field effect transistor, capable of achieving a reduction in topology by forming a trench on a silicon substrate by use of a temporary field oxide film and forming a gate electrode in the trench and capable of eliminating occurrence of a spiking phenomenon due to a metal wiring being in direct contact with the silicon substrate by forming a silicide film on a source and a drain, and capable of obtaining an increased contact margin of the metal wiring by overlapping the silicide film with a field oxide film formed on the silicon substrate.

6 Claims, 15 Drawing Sheets

FIG. 2
PRIOR ART

ENTRY No.

| | 2 | 4 | 3 |
|---|---|---|---|
| 1 | 0000 | 1 | AA AA AA AA |
| 2 | xxxx | 0 | XX XX XX XX |
| . | . | . | . |
| . | . | . | . |
| . | . | . | . |
| . | . | . | . |
| . | . | . | . |
| . | . | . | . |
| . | . | . | . |
| 256 | xxxx | 0 | XX XX XX XX |

FIG. 3
PRIOR ART

|  | | 2 | 4 | 3 |
|---|---|---|---|---|
| ENTRY No. | | ↓ | ↓ | ↓ |
| 1 | | 0000 | 1 | AA AA AA AA |
| 2 | | 0000 | 1 | BB BB BB BB |
| . | | x x x x | 0 | XX XX XX XX |
| 256 | | x x x x | 0 | XX XX XX XX |

FIG. 6

ADD.

| | |
|---|---|
| 000000 | MOV R1,R0 |
| ⋮ | DEC R1 |
| 00000F | ⋮ |
| 000100 | ⋮ |
| ⋮ | |
| 00010E | BNE 0001 0 |
| 00010F | |

FIG. 8

```
       x:
push a  }·····101    mov sp-1,c  }·····103
push b              add sp-2,c
bsr  x  }·····102    rts         }·····104
pop  b  }·····105
pop  a
```

5,620,911

METHOD FOR FABRICATING A METAL FIELD EFFECT TRANSISTOR HAVING A RECESSED GATE

BACKGROUND OF THE INVENTION

1. Field of the Invention

The present invention relates to a method for fabricating a metal oxide semiconductor field effect transistor (MOSFET) of a semiconductor circuit, and more particularly to a method for fabricating a MOSFET, capable of reducing the topology of a gate electrode of the MOSFET.

2. Description of the Prior Art

Generally, MOSFETs are employed in a semiconductor circuit. Such a MOSFET include a gate electrode formed on an active region of a semiconductor substrate and insulated from the semiconductor substrate, and a source and a drain respectively formed on opposite ends of the semiconductor substrate and having a junction structure. Conductors are in contact with the source and drain, respectively, so that the MOSFET is connected to other elements, thereby forming a circuit.

In a highly integrated semiconductor circuit, multilayered conductors are overlapped with the semiconductor substrate, thereby increasing the topology of the semiconductor circuit. Such an increase in topology results in an undesirable residue generated after patterning an upper layer deposited over the multilayer structure or formation of an inaccurate pattern.

A conventional method for fabricating a MOSFET having the general structure will be described in conjunction with FIG. 1.

In accordance with the method shown in FIG. 1, first, a mask is formed on a p type silicon substrate 1 so that a predetermined field region of the silicon substrate 1 is exposed through the mask. Using the mask, p$^+$ type ions are implanted in the silicon substrate 1, thereby forming channel stopper regions 2. Thereafter, a field oxide film 3 is formed on the silicon substrate 1. On a portion of the silicon substrate 1 corresponding to an active region, a gate oxide film 4 and a gate electrode 5 comprised of a polysilicon film are then formed. Subsequently, N$^-$ type ions are implanted in the silicon substrate 1. After the implantation of N$^-$ type ions, insulating film spacers 6 are formed on side walls of the gate electrode 5, respectively. N$^+$ type ions are then implanted in the silicon substrate 1, thereby forming a source 7A and a drain 7B. Over the entire exposed surface of the resulting structure, an interlayer insulating film 8 are formed. The interlayer insulating film 8 is then subjected to an etch so as to form contact holes 9 through which the source 7A and the drain 7B are exposed, respectively. Finally, a metal wiring 10 being in contact with the source 7A and the drain 7B is formed on the resulting structure.

In accordance with the conventional method, however, an increase in topology occurs because the gate electrode is protruded from the upper surface of the silicon substrate. As a result, the conventional method encounters a problem of an addition of a planarization process step required upon forming the upper layer. The conventional method also involves a problem of a spiking phenomenon occurring at the surface of the substrate because the metal wiring is in direct contact with the source and the drain.

SUMMARY OF THE INVENTION

Therefore, an object of the invention is to provide a method for fabricating a MOSFET, capable of achieving a reduction in topology by forming a trench on a silicon substrate and forming a gate electrode in the trench.

Another object of the invention is to provide a method for fabricating a MOSFET, capable of eliminating occurrence of a spiking phenomenon by forming a silicide film on a source and a drain.

In accordance with the present invention, these object can be accomplished by providing a method for fabricating a metal oxide semiconductor field effect transistor, comprising the steps of: forming a pattern for an element isolation mask on a silicon substrate such that the silicon substrate has an exposed portion disposed at an active region including a predetermined region where a gate electrode is to be formed; forming a field oxide film on the exposed portion of the silicon substrate by use of a thermal oxidation process and simultaneously forming a temporary field oxide film at the predetermined region where the gate electrode is to be formed; implanting impurity ions of a conduction type different from that of the silicon substrate in a high concentration in exposed portions of the silicon substrate, thereby forming a source and a drain, and then removing the element isolation mask pattern; etching the temporary field oxide film, thereby forming a trench in the silicon substrate; forming a gate oxide film and the gate electrode on a bottom surface of the trench; and implanting impurity ions of the conduction type different from that of the silicon substrate in a low concentration in exposed portions of the silicon substrate, thereby forming lightly doped regions respectively at opposite ends of the gate electrode, so that the gate electrode exhibits a low topology.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2D are sectional views respectively illustrating a method for fabricating a MOSFET in accordance with a first embodiment of the present invention.

Figure 2A:
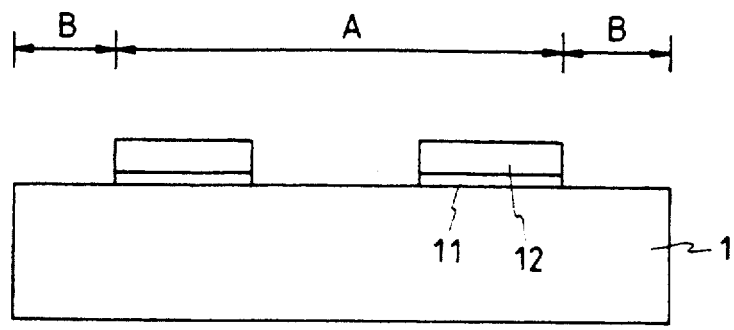
FIGS. 2A to 2D are sectional views respectively illustrating a method for fabricating a MOSFET in accordance with a first embodiment of the present invention.

In accordance with this embodiment, an oxide film 11 and a nitride film 12 are formed in a sequential manner over a p type silicon substrate 1, as shown in FIG. 2A. The oxide film 11 and the nitride film 12 are subjected to a local oxidation of silicon (LOCOS) process so as to etch portions of the films 11 and 12 disposed at a field region B and thereby form a pattern for an element isolation mask. At this time, portions of the oxide film 11 and nitride film 12 disposed at a portion of an active region A where a gate electrode is to be formed, thereby forming a pattern for the gate electrode. Under this condition, implantation of p$^+$ type ions is carried out. By the ion implantation, channel stopper regions 2 are formed in the silicon substrate 1.

The LOCOS process may be carried out after sequentially forming the oxide film 11, a polysilicon film (not shown) and the nitride film 12 over the silicon substrate 1.

Figure 2B:
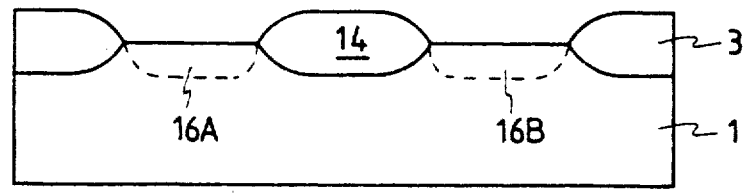

A field oxide film 3 is formed on exposed portions of the silicon substrate 1 using a thermal oxidation process, as shown in FIG. 2B. Simultaneously, a temporary field oxide film 14 is also formed at the portion of active region A where the gate electrode is to be formed. Thereafter, the patterns of the nitride film 12 and oxide film 11 are removed. N$^+$ type ions are then implanted in exposed portions of the silicon substrate 1, thereby forming a source 16A and a drain 16B.

Figure 2C:
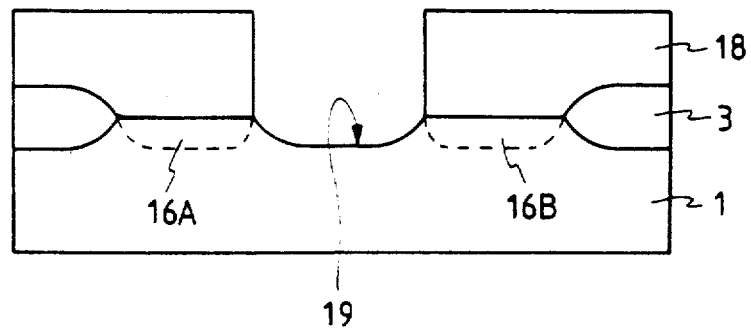

A photoresist film pattern 18 is then formed over the resulting structure such that it is not disposed over the temporary field oxide film 14 so as to subsequently remove the temporary field oxide film 14, as shown in FIG. 2C. Thereafter, the temporary field oxide film 14 exposed is removed using an isotropic etch process, thereby forming a trench 19.

Figure 2D:
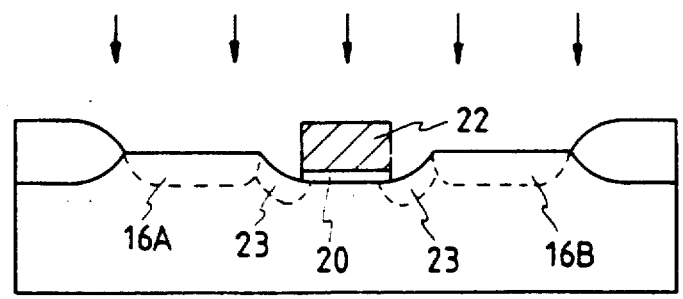

The photoresist film pattern 18 is then removed, as shown in FIG. 2D. In the trench 19, a gate oxide film 20 and a gate electrode 22 comprised of a doped gate polysilicon film are then formed. Subsequently, N$^-$ type ions are implanted in exposed portions of the silicon substrate 1, thereby forming N$^-$ regions 23 respectively at opposite lower ends of the gate electrode 22.

In accordance with the first embodiment of the present invention as mentioned above, a reduction in topology is achieved by forming the gate electrode 22 in the trench 19.

FIGS. 3A to 3E are sectional views respectively illustrating a method for fabricating a MOSFET in accordance with a second embodiment of the present invention. In FIGS. 3A to 3E, elements respectively corresponding to those in FIGS. 2A to 2D are denoted by the same reference numerals.

Figure 3A:
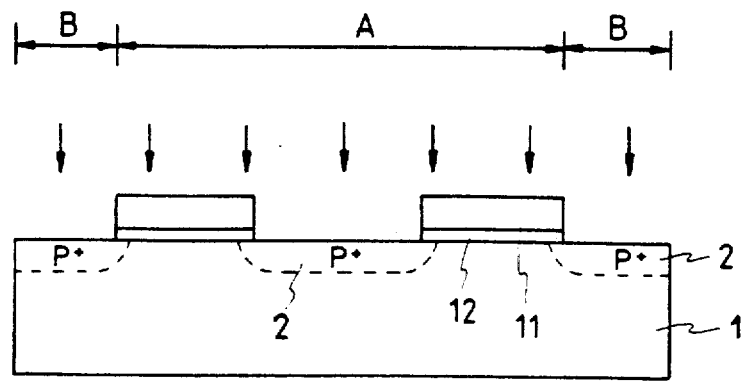
FIGS. 3A to 3E are sectional views respectively illustrating a method for fabricating a MOSFET in accordance with a second embodiment of the present invention.

In accordance with this embodiment, an oxide film 11 and a nitride film 12 are formed in a sequential manner over a p type silicon substrate 1, as shown in FIG. 3A. The oxide film 11 and the nitride film 12 are subjected to a LOCOS process so as to etch portions of the films 11 and 12 disposed at a field region B and thereby form a pattern for an element isolation mask. At this time, portions of the oxide film 11 and nitride film 12 disposed at a portion of an active region A where a gate electrode is to be formed, thereby forming a pattern for the gate electrode. Under this condition, implantation of p$^+$ type ions is carried out. By the ion implantation, channel stopper regions 2 are formed in the silicon substrate 1.

The LOCOS process may be carried out after sequentially forming the oxide film 11, a polysilicon film (not shown) and the nitride film 12 over the silicon substrate 1.

Figure 3B:
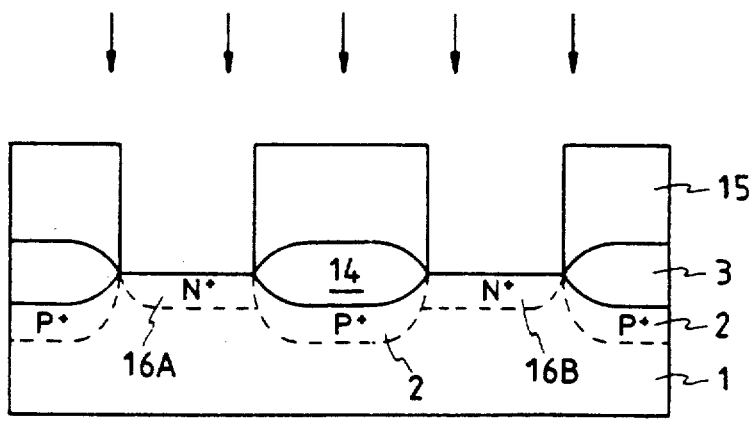

A field oxide film 3 is formed on exposed portions of the silicon substrate 1 using a thermal oxidation process, as shown in FIG. 3B. Simultaneously, a temporary field oxide film 14 is also formed at the portion of active region A where the gate electrode is to be formed. Thereafter, the patterns of the nitride film 12 and oxide film 11 are removed. A first photoresist film pattern 15 is then formed on the field oxide film 3 and the temporary field oxide film 14. After the formation of the first photoresist film pattern 15, N$^+$ type ions are implanted in exposed portions of the silicon substrate 1, thereby forming a source 16A and a drain 16B.

Figure 3C:
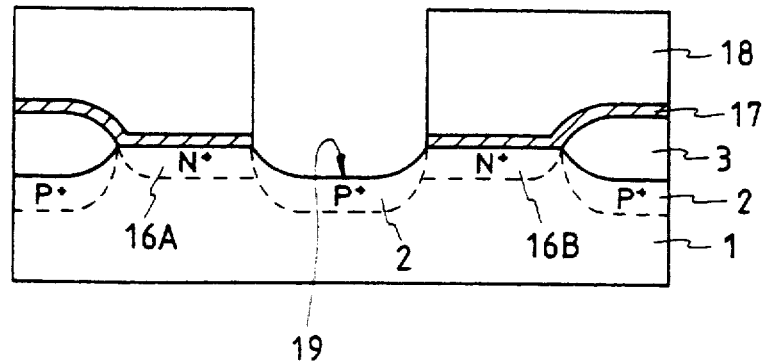

Thereafter, the first photoresist film pattern 15 is removed, as shown in FIG. 3C. Over the entire exposed surface of the resulting structure, a second polysilicon film 17 is coated to a predetermined thickness. Over the second polysilicon film 17, a second photoresist film pattern 18 is then formed. The second photoresist film pattern 18 is not disposed over the temporary field oxide film 14 so as to subsequently remove the temporary field oxide film 14. The second polysilicon film 17 is then subjected to an anisotropic etch so as to remove its exposed portion. Thereafter, the temporary field oxide film 14 exposed after the partial removal of the second polysilicon film 17 is removed using an isotropic etch process, thereby forming a trench 19.

Figure 3D:
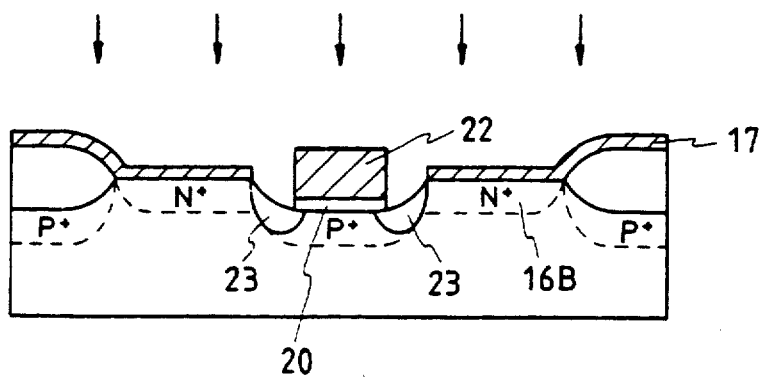

The second photoresist film pattern 18 is then removed, as shown in FIG. 3D. In the trench 19, a gate oxide film 20 and a gate electrode 22 comprised of a doped gate polysilicon film are then formed. Subsequently, N$^-$ type ions are implanted in exposed portions of the silicon substrate 1, thereby forming N$^-$ regions 23 respectively at opposite lower ends of the gate electrode 22.

Figure 3E:
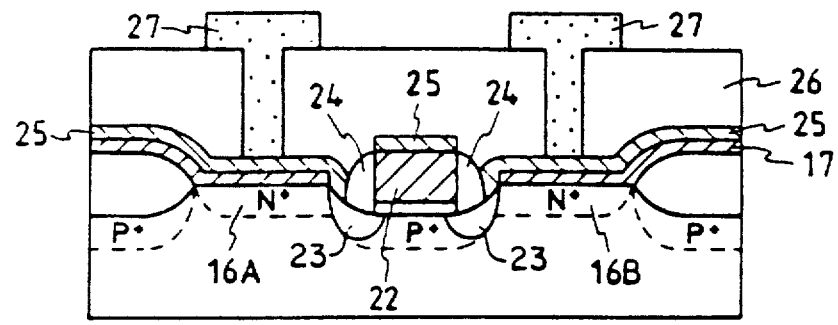

Over the entire exposed surface of the resulting structure, a low temperature oxide film is then deposited, as shown in FIG. 3E. The low temperature oxide film is fully etched, thereby forming low temperature film spacers 24 respectively on side walls of the gate electrode 22. Thereafter, a silicide film 25 is selectively formed on the second polysilicon film 17 and the gate electrode 22. Over the entire exposed surface of the resulting structure, an interlayer insulating film 26 is deposited. Finally, a metal wiring 27 is formed on the interlayer insulating film 26. The metal wiring 27 is in contact with the silicide film 25 electrically connected to the source 16A and the drain 16B. The silicide film 25 may be formed by selectively depositing a transition metal and then thermally treating the transition metal film.

In accordance with the second embodiment of the present invention as mentioned above, a reduction in topology is achieved by forming the gate electrode 22 in the trench 19. Occurrence of the spiking phenomenon is also avoided by connecting the metal wiring 27 to the silicide film 25.

Figure 4A:
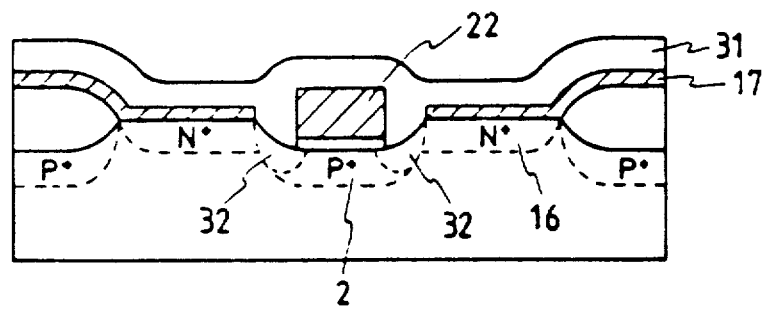
Figure 4B:
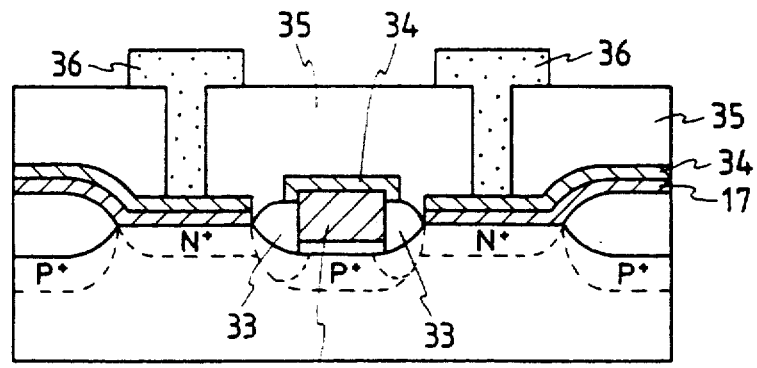
Figure 5:
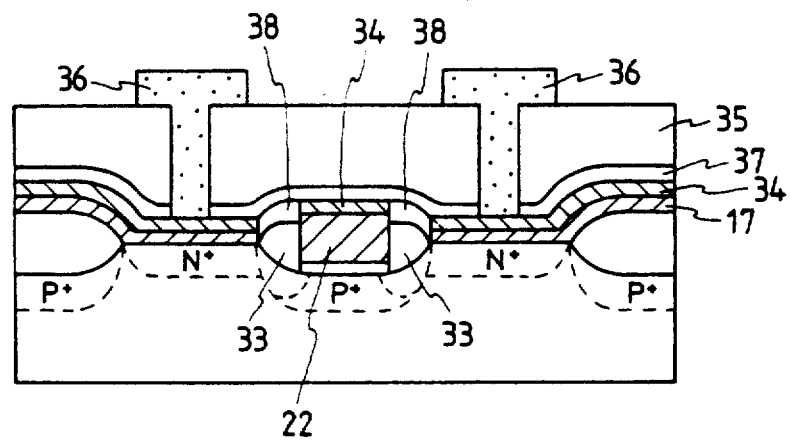

FIGS. 4A and 4B are sectional views respectively illustrating a method for fabricating a MOSFET in accordance with a third embodiment of the present invention. In FIGS. 4A and 4B, elements respectively corresponding to those in FIGS. 3A to 3E are denoted by the same reference numerals.

In accordance with this embodiment, the same steps as those shown in FIGS. 2A to 2C are carried out. After completion of the step of FIG. 3C, the second photoresist film pattern 18 is removed, thereby forming a trench 19, as shown in FIG. 4A. Subsequently, a gate electrode 22 comprised of a gate oxide film 20 and a doped polysilicon film is formed in the trench 19. Over the entire exposed surface of the resulting structure, a phosphorous silicate glass (PSG) film 31 is then coated. The PSG film 31 is then subjected to a thermal treatment at a high temperature. Thereafter, N$^-$ type ions are implanted in exposed portions of the silicon substrate 1, thereby forming N$^-$ regions 32 respectively at opposite lower ends of the gate electrode 22.

The PSG film 31 is then fully etched, thereby forming insulating spacers 33 respectively on side walls of the gate electrode 22, as shown in FIG. 4B. Thereafter, a silicide film 34 is selectively formed on the second polysilicon film 17 and the gate electrode 22. Over the entire exposed surface of the resulting structure, an interlayer insulating film 35 is deposited. Finally, a metal wiring 26 is formed on the interlayer insulating film 26. The metal wiring 36 is in contact with the silicide film 34 electrically connected to the source 16A and the drain 16B. The silicide film 34 may be formed by selectively depositing a transition metal and then thermally treating the transition metal film.

Figure 1:
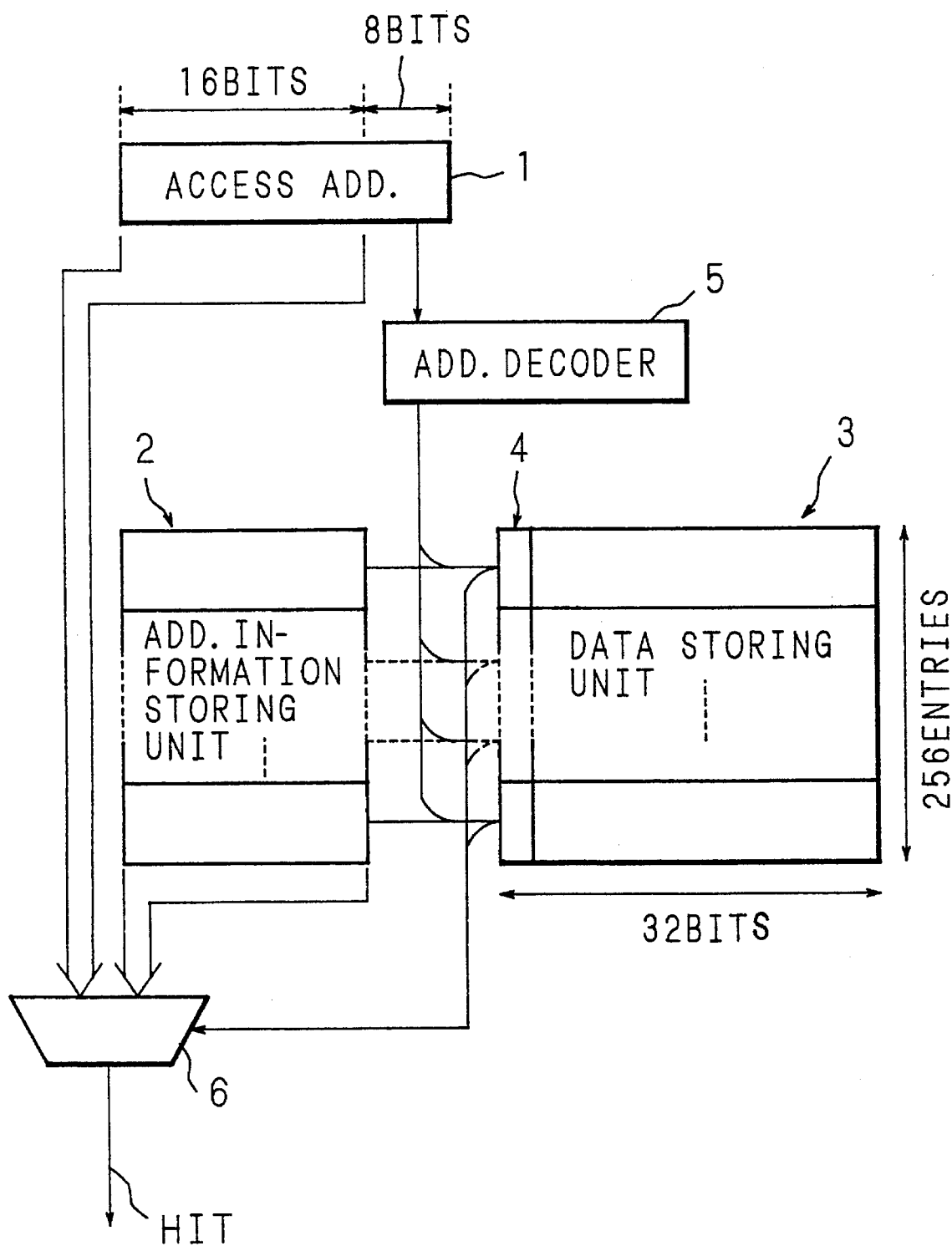
FIG. 1 is a sectional view illustrating a conventional method for fabricating a MOSFET having the general structure.
Figure 4:
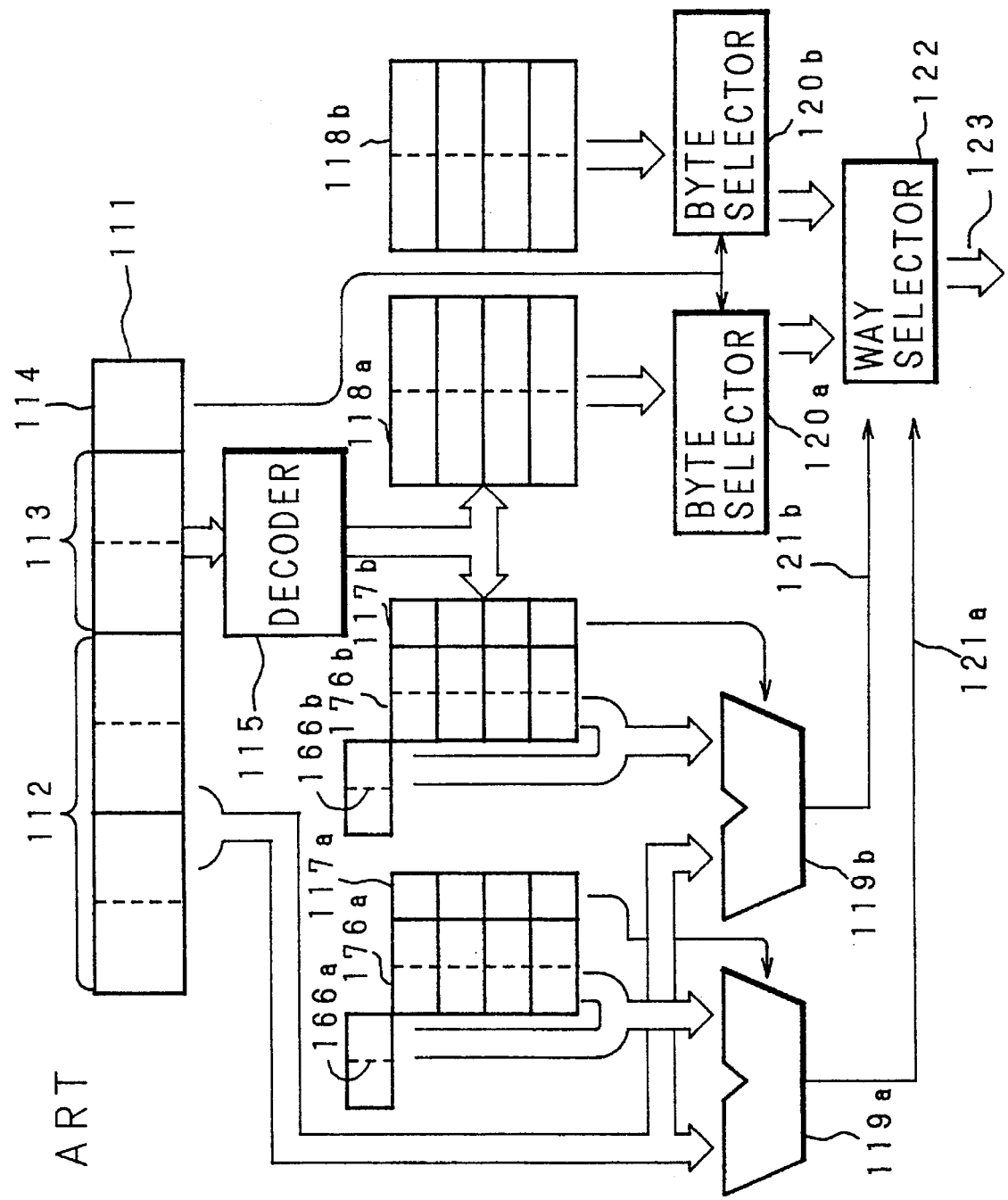
FIGS. 4A and 4B are sectional views respectively illustrating a method for fabricating a MOSFET in accordance with a third embodiment of the present invention.
Figure 5:
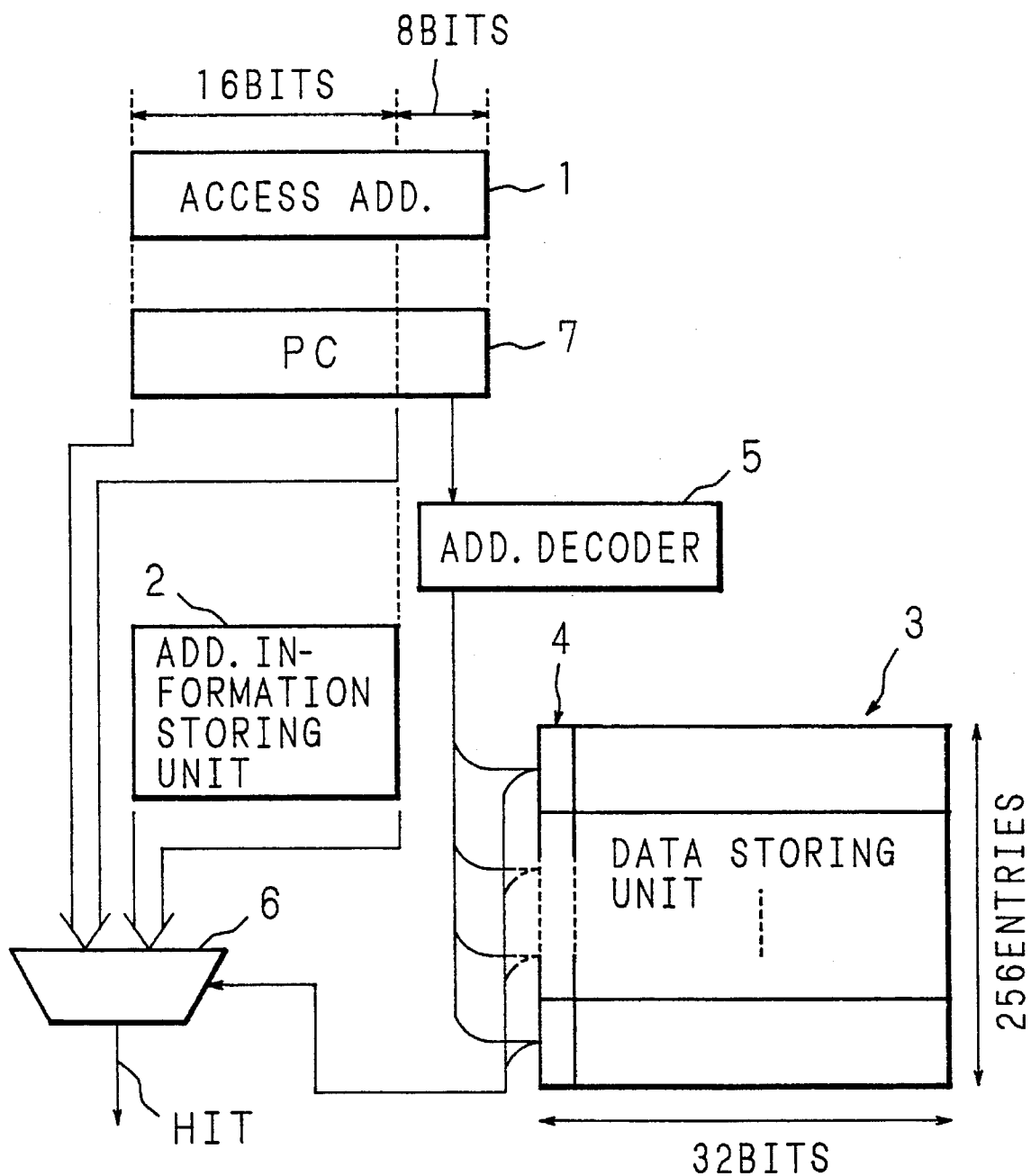
FIG. 5 is a sectional view illustrating a method for fabricating a MOSFET in accordance with a fourth embodiment of the present invention.
Figure 7:
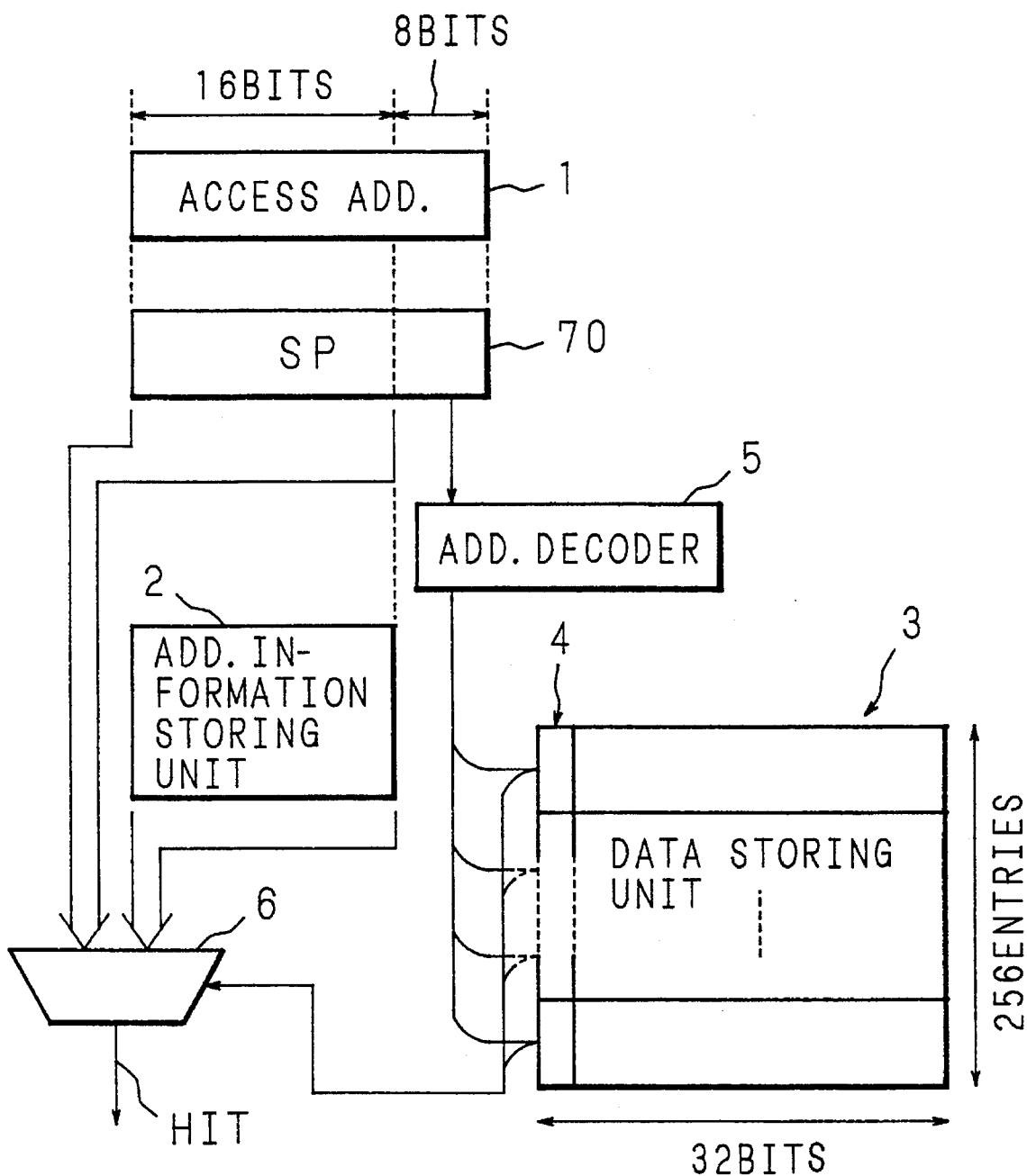
Figure 9:
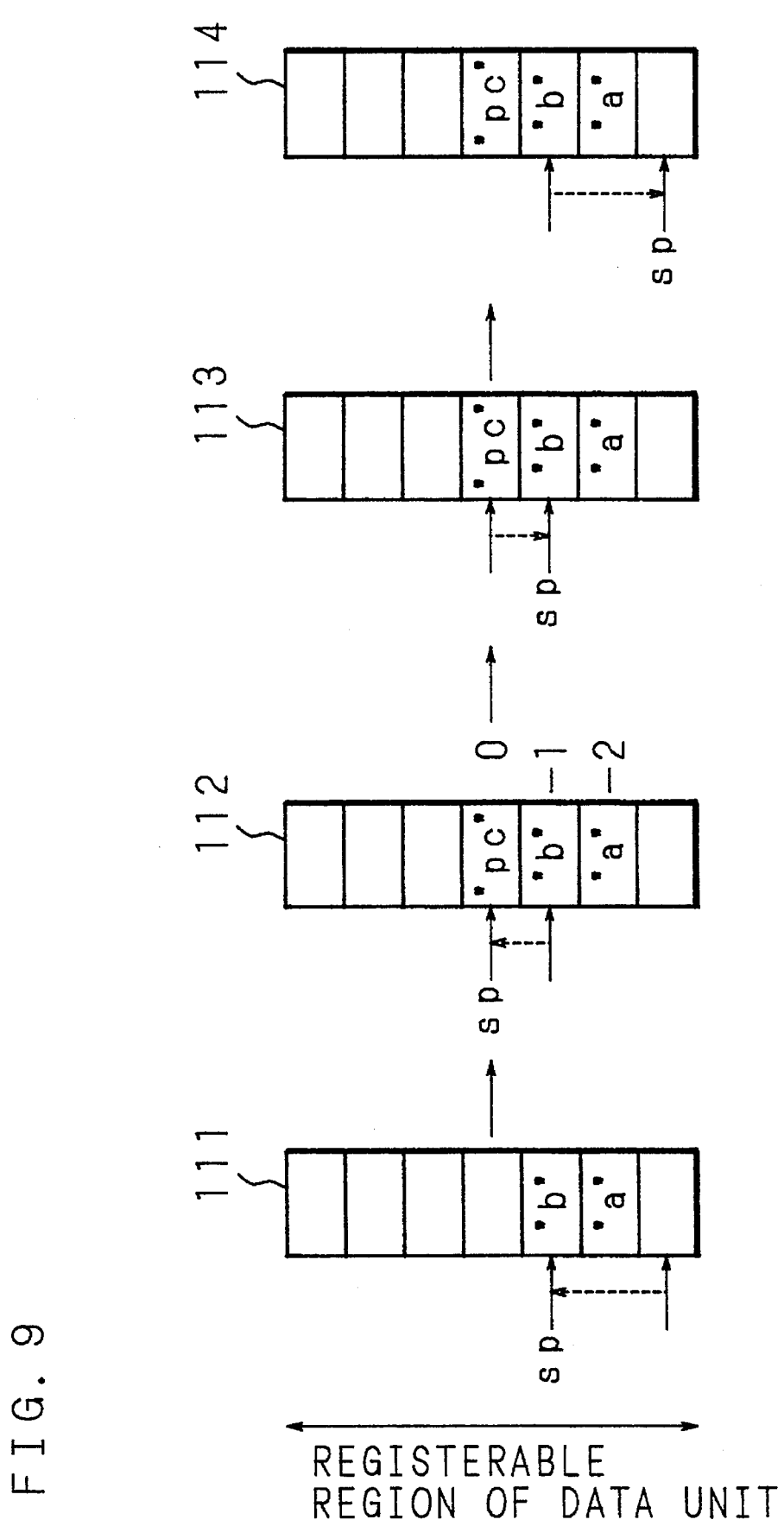
Figure 10:
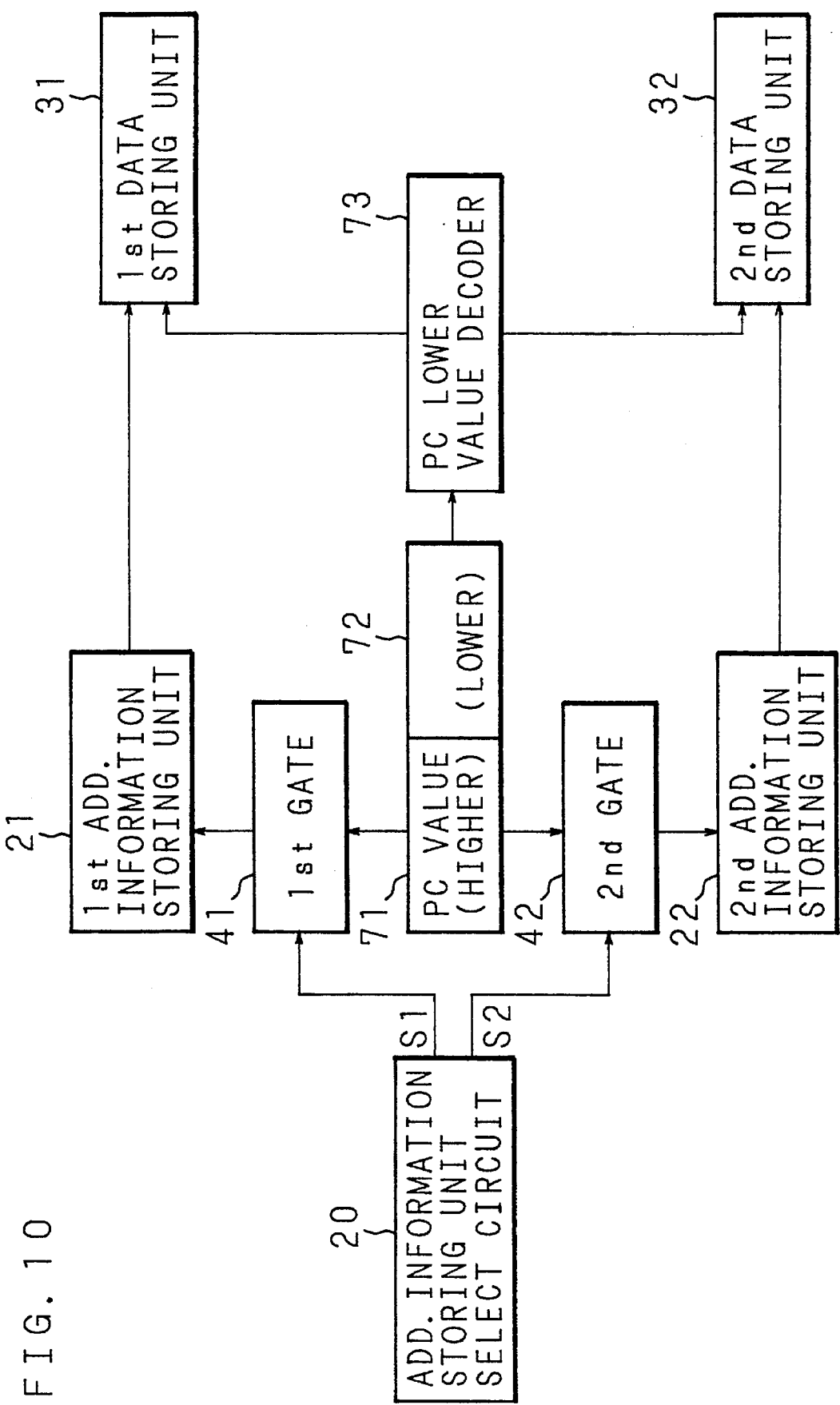
Figure 11:
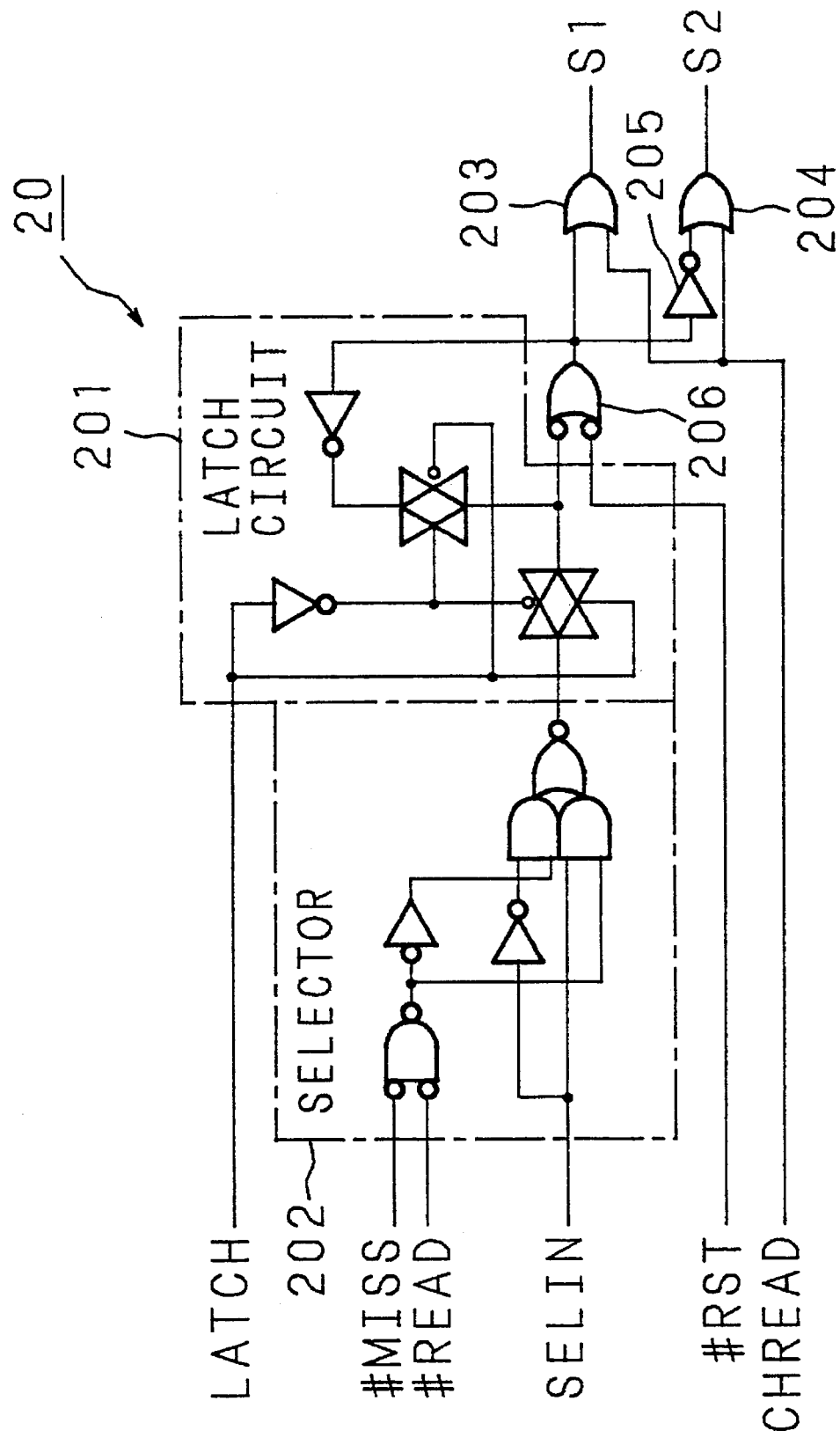
Figure 12:
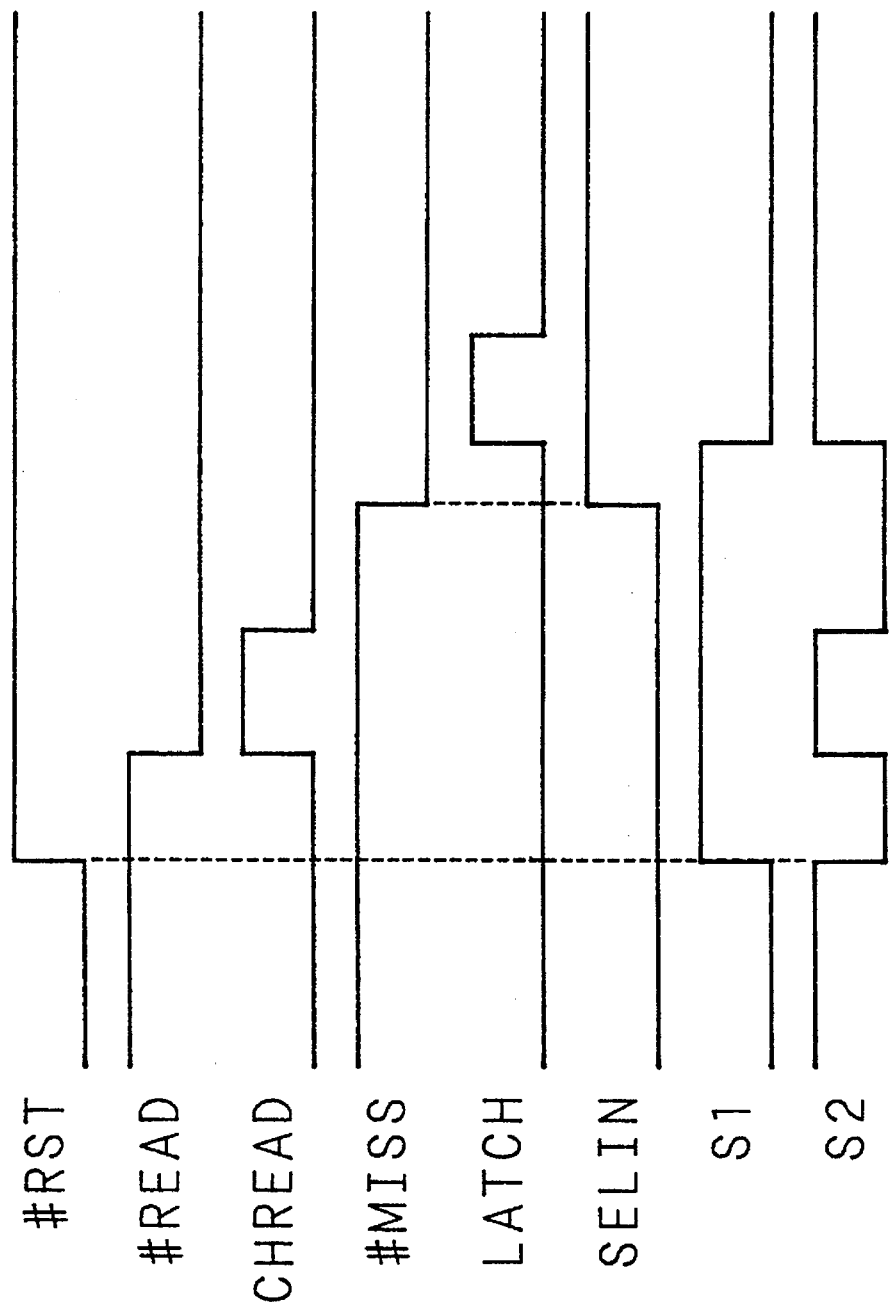
Figure 13:
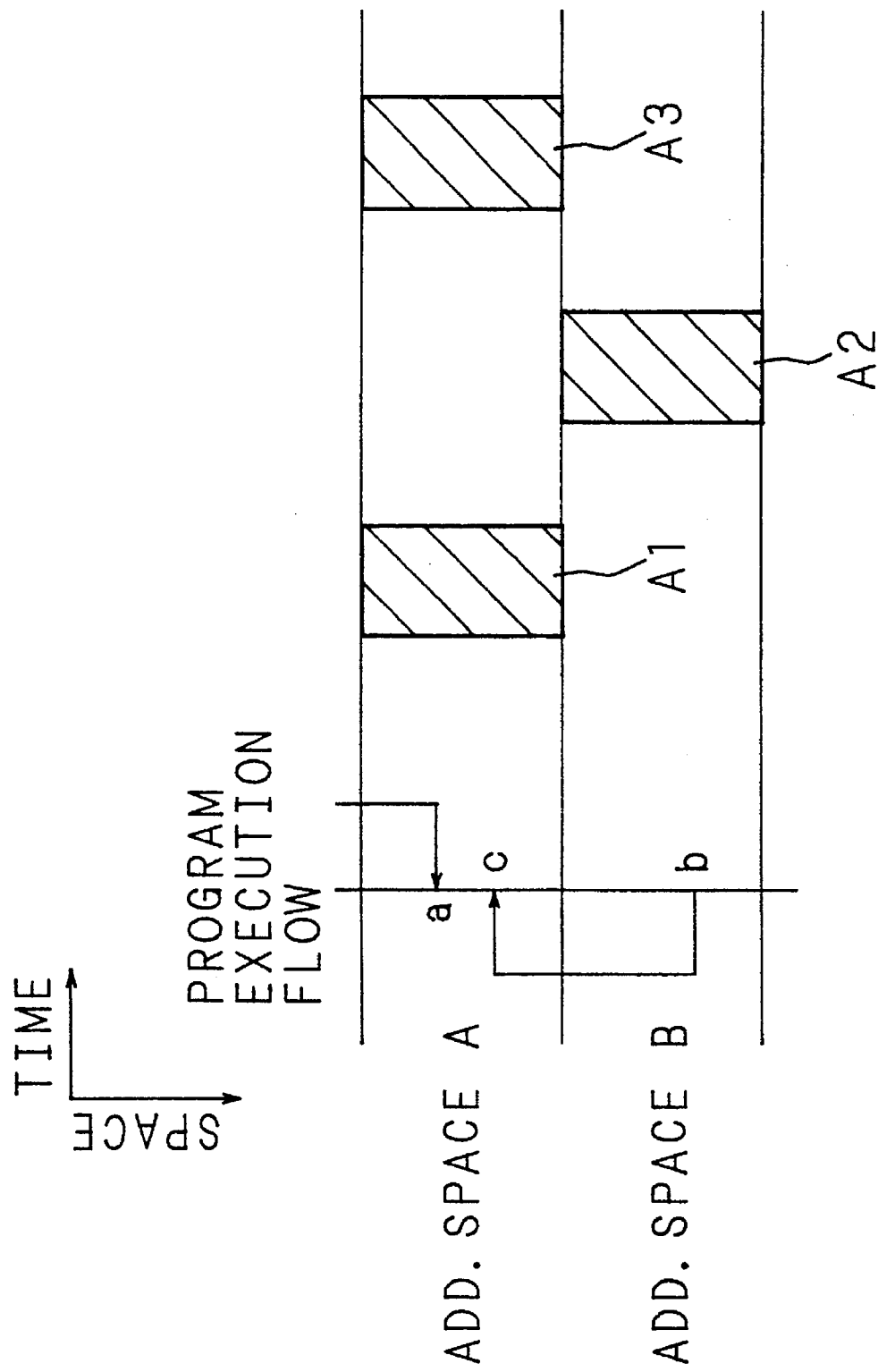
Figure 14:
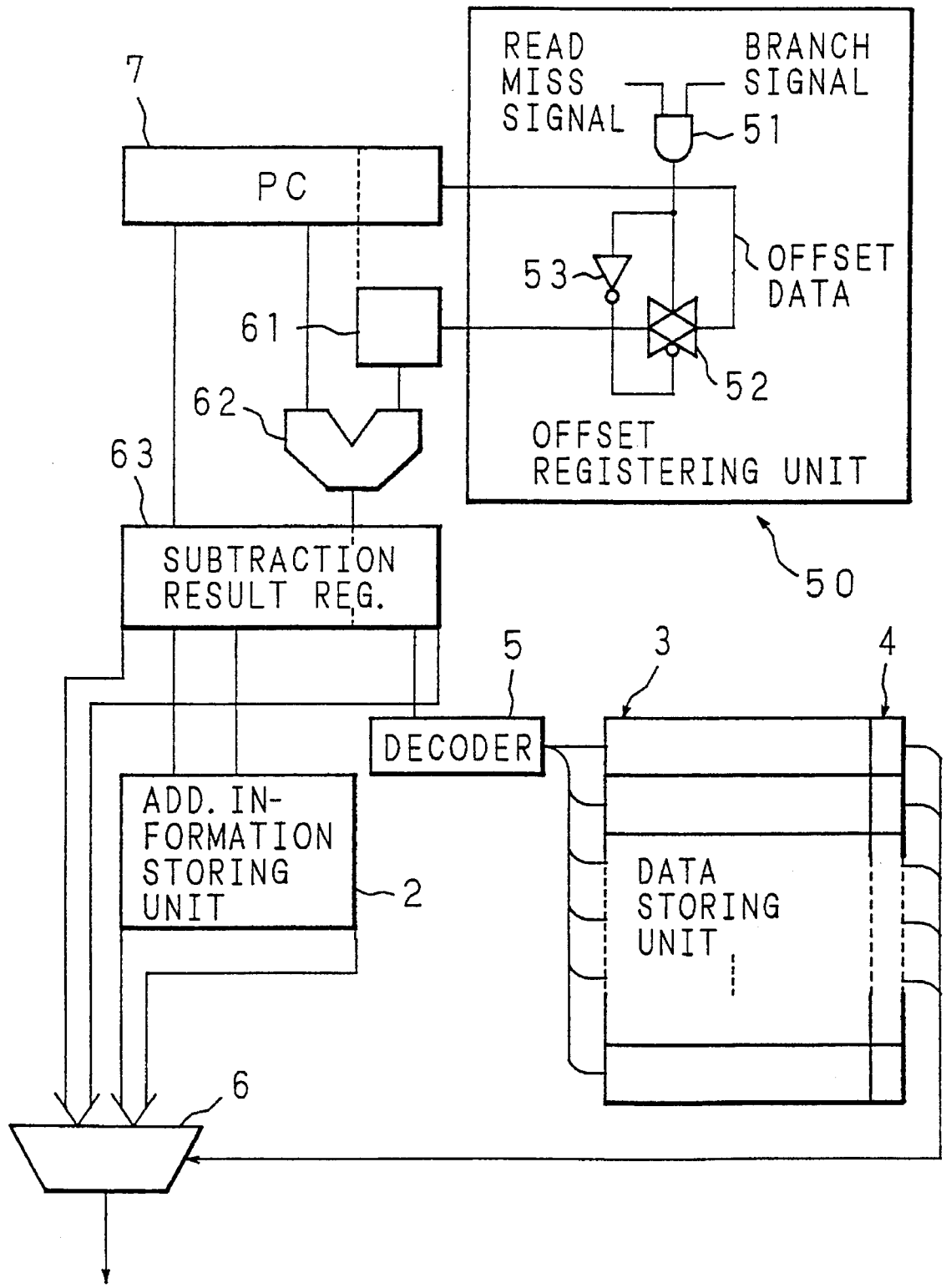
Figure 15:
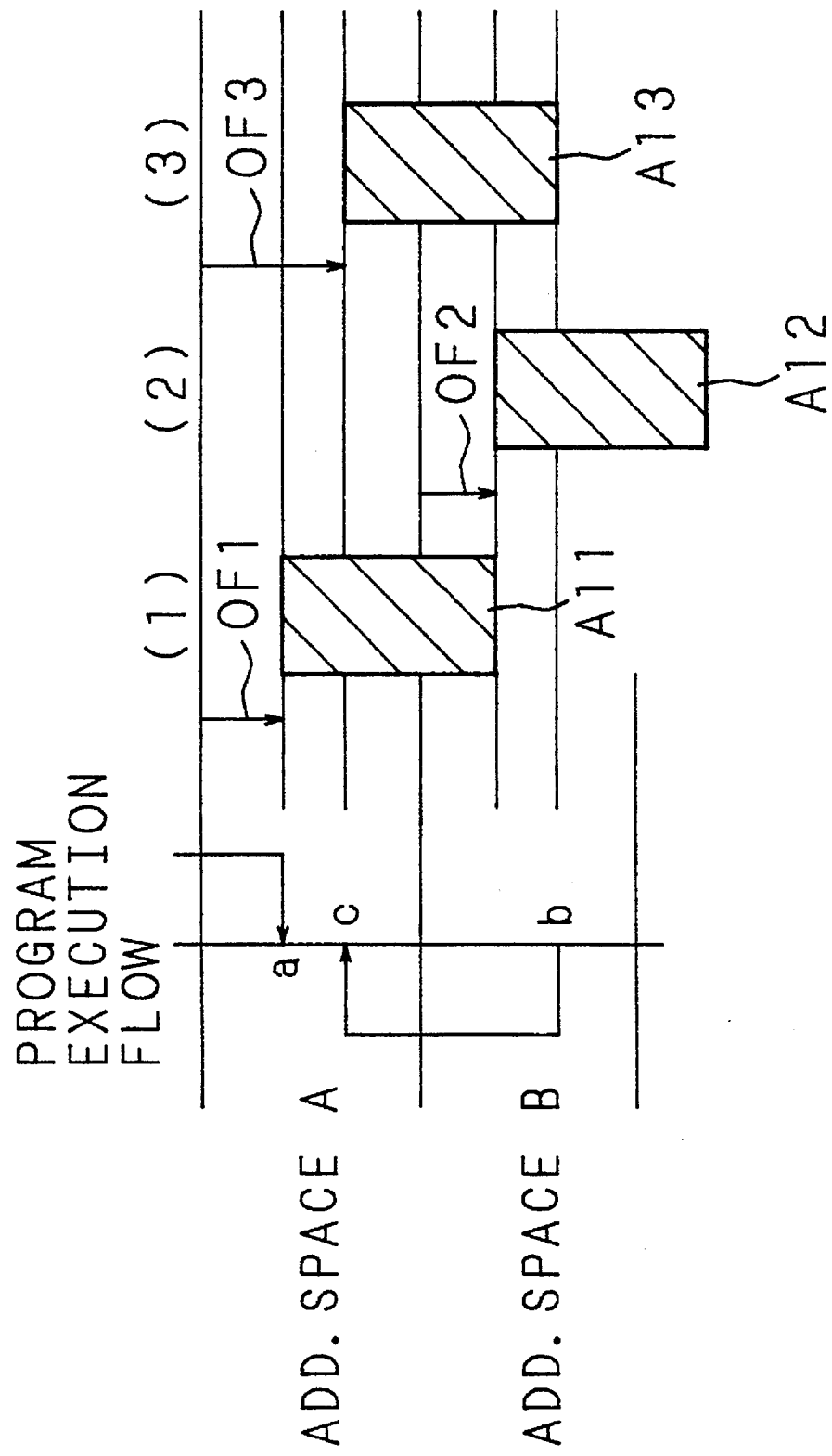
Figure 1:
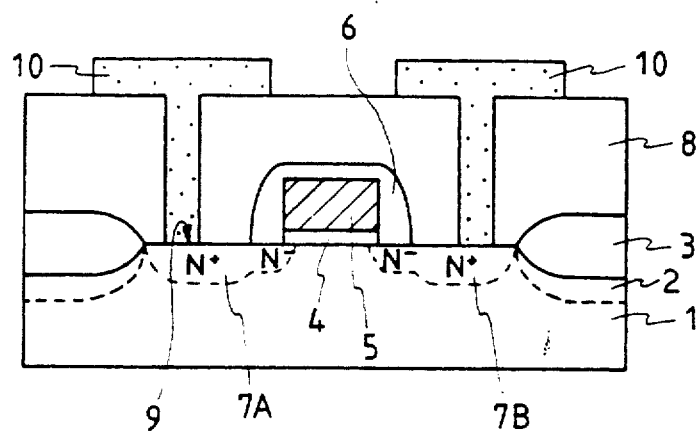

FIG. 5 is a sectional view illustrating a method for fabricating a MOSFET in accordance with a fourth embodiment of the present invention. In FIG. 5, elements respectively corresponding to those in FIGS. 4A and 4B are denoted by the same reference numerals.

In accordance with this embodiment, the same steps as those shown in FIGS. 3A to 3D are carried out. After completion of the step of FIG. 3D, a transition metal film (not shown) and an oxide film 37 are deposited over the resulting structure. The resulting structure is then subjected to a thermal treatment at a high temperature. Thereafter, a silicide film 34 is selectively formed on the second polysilicon film 17 and the gate electrode 22. The remaining transition film is then oxidized, thereby forming a transition metal oxide film 38. Over the entire exposed surface of the resulting structure, an interlayer insulating film 35 is deposited. Finally, a metal wiring 36 is formed on the interlayer insulating film 26. The metal wiring 36 is in contact with the silicide film 34 electrically connected to the source 16A and the drain 16B.

As apparent from the above description, it is possible to reduce the topology of the gate electrode of MOSFET formed on the silicon substrate by the temporary field oxide film in accordance with the present invention. Occurrence of the spiking phenomenon is also avoided by forming the second polysilicon film and the silicide film on the source and drain and bring the metal wiring into contact with the silicide film. Since the second polysilicon film and the silicide film overlap with the field oxide film, an increased contact margin of the metal wiring is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

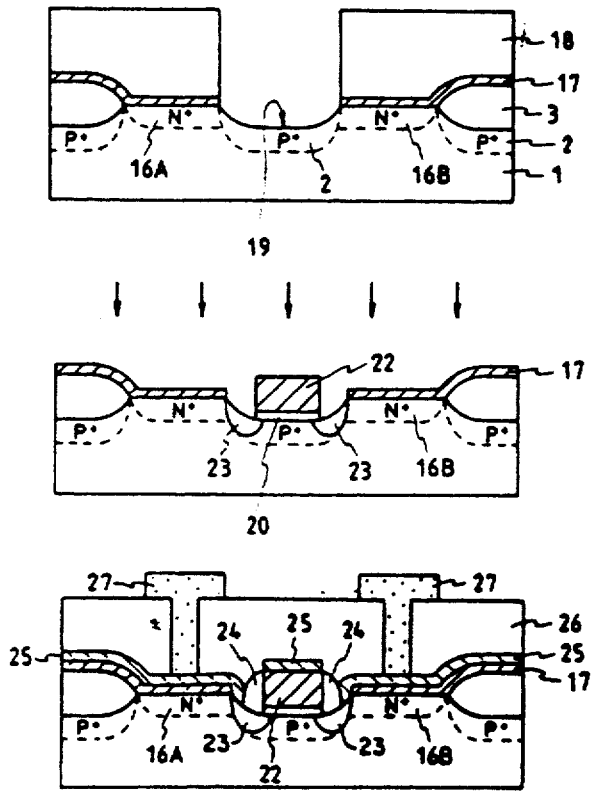

What is claimed is:

1. A method for fabricating a metal oxide semiconductor field effect transistor, comprising the steps of:

forming an element isolation mask pattern on a silicon substrate such that the silicon substrate has an exposed portion disposed at an active region including a region where a gate electrode is to be formed;

forming a field oxide film on the exposed portion of the silicon substrate by use of a thermal oxidation process and forming a temporary field oxide film at the region where the gate electrode is to be formed;

removing the element isolation mask pattern;

implanting impurity ions of a conduction type opposite to that of the silicon substrate in a first concentration in exposed portions of the silicon substrate, thereby forming a source and a drain;

depositing a polysilicon film on an entire exposed surface of a resulting structure obtained after the formation of the source and the drain;

forming a photoresist film pattern on the polysilicon film such that the photoresist film pattern is not disposed over the temporary field oxide film;

etching an exposed portion of the polysilicon film and the temporary field oxide film, thereby forming a trench in the silicon substrate;

removing the photoresist film pattern;

forming a gate oxide film and the gate electrode on a bottom surface of the trench;

implanting further impurity ions of a conduction type opposite to that of the silicon substrate in a second concentration in further exposed portions of the silicon substrate, said second concentration being lower than said first concentration, thereby forming lightly doped regions at opposite ends of the gate electrode; and forming insulating film spacers on side walls of the gate electrode, and then selectively forming a silicide film on the gate electrode and the polysilicon film, so that the silicide film is deposited on the source and the drain.

2. A method in accordance with claim 1, further comprising the step of implanting impurity ions of the same conduction type as that of the silicon substrate in exposed portions of the silicon substrate just after the formation of the element isolation mask pattern, thereby forming channel stopper regions.

3. A method in accordance with claim 1, whereby the step of forming the silicide film comprises the steps of (a) depositing a transition metal film over an entire exposed surface of a resulting structure obtained after the formation of the element isolation mask pattern, (b) a subjecting a further resulting structure obtained after the deposition of the transition metal film to a thermal treatment, thereby forming a silicide film on the gate electrode and the polysilicon film, and (c) removing the transition metal film remaining.

4. A method for fabricating a metal oxide semiconductor field effect transistor, comprising the steps of:

forming an element isolation mask pattern on a silicon substrate such that the silicon substrate has an exposed portion disposed at an active region including a region where a gate electrode is to be formed;

forming a field oxide film on the exposed portion of the silicon substrate by use of a thermal oxidation process and forming a temporary field oxide film at the region where the gate electrode is to be formed;

removing the element isolation mask pattern;

implanting impurity ions of a conduction type opposite to that of the silicon substrate in a first concentration is exposed portions of the silicon substrate, thereby forming a source and a drain;

depositing a polysilicon film on an entire exposed surface of a resulting structure obtained after the formation of the source and the drain;

forming a photoresist film pattern on the polysilicon film such that the photoresist film pattern is not disposed over the temporary field oxide film;

etching an exposed portion of the polysilicon film and the temporary field oxide film, thereby forming a trench in the silicon substrate;

removing the photoresist film pattern;

forming a gate oxide film and the gate electrode on a bottom surface of the trench;

forming a phosphorous silicate glass film over an entire exposed surface of a resulting structure obtained after the formation of the gate electrode, subjecting a further resulting structure obtained after the formation of the phosphorous silicate glass film to a thermal treatment;

implanting further impurity ions in a second concentration in further exposed portions of the silicon substrate, said second concentration being lower than said first concentration, thereby forming lightly doped regions at opposite ends of the gate electrode;

fully etching the phosphorous silicate glass film, thereby forming phosphorous silicate glass film spacers on side walls of the gate electrode; and selectively forming a silicide film on the gate electrode and the polysilicon film, so that the silicide film is deposited on the source and the drain.

5. A method in accordance with claim 4, whereby the step of forming the silicide film comprises the steps of (a) depositing a transition metal film over an entire exposed surface of a resulting structure obtained after the formation of phosphorous silicate glass film spacers, (b) subjecting a further resulting structure obtained after the deposition of the transition metal film to a thermal treatment, thereby forming the silicide film on the gate electrode and the polysilicon film, and (c) removing the transition metal film remaining.

6. A method in accordance with claim 4, wherein the step of forming the silicide film comprises the steps of (a) depositing a transition metal film an oxide film over an entire exposed surface of a resulting structure obtained after the formation of said phosphorous silicate glass film spacers, (b) subjecting a further resulting structure obtained after the deposition of the oxide film to a thermal treatment, thereby forming the silicide film on the gate electrode and the polysilicon film, and (c) oxidizing the transition metal film disposed on the phosphorous silicate glass film spacers, thereby forming said transition metal oxide film.

* * * * *

UNITED STATES PATENT AND TRADEMARK OFFICE
CERTIFICATE OF CORRECTION

PATENT NO. : 5,620,911
DATED : April 15, 1997
INVENTOR(S) : Sang H. Park

It is certified that error appears in the above-identified patent and that said Letters Patent is hereby corrected as shown below:

The title page should be deleted to appear as per attached title page.

Please delete Drawing sheets 1-15 and substitute drawing sheets 1-7 as per attached Signed and Sealed this Seventh Day of October, 1997

*Attest:*

BRUCE LEHMAN

*Attesting Officer*      *Commissioner of Patents and Trademarks*

United States Patent [19]
Park

[11] Patent Number: 5,620,911
[45] Date of Patent: Apr. 15, 1997

[54] METHOD FOR FABRICATING A METAL FIELD EFFECT TRANSISTOR HAVING A RECESSED GATE

[75] Inventor: Sang H. Park, Kyoungki-do, Rep. of Korea

[73] Assignee: Hyundai Electronics Industries Co., Ltd., Kyoungki-do, Rep. of Korea

[21] Appl. No.: 365,293

[22] Filed: Dec. 28, 1994

[30] Foreign Application Priority Data

Dec. 31, 1993 [KR] Rep. of Korea ............ 93-31827
Dec. 31, 1993 [KR] Rep. of Korea ............ 93-31863
Dec. 31, 1993 [KR] Rep. of Korea ............ 93-31879
Dec. 31, 1993 [KR] Rep. of Korea ............ 93-31889

[51] Int. Cl.⁶ ............ H01L 21/265; H01L 21/44; H01L 21/255; H01L 21/302
[52] U.S. Cl. ............ 438/297; 438/298; 438/303; 438/307; 438/291
[58] Field of Search ............ 437/69, 40 RG, 437/41 RG, 44, 45, 29, 190, 160, 164, 203, 162

[56] References Cited

U.S. PATENT DOCUMENTS

| 4,271,421 | 6/1981 | McElroy | 357/41 |
| 4,685,196 | 8/1987 | Lee | 437/41 RG |
| 4,939,100 | 7/1990 | Jeuch et al. | 437/203 |
| 5,108,937 | 4/1992 | Tsai et al. | 437/69 |
| 5,169,796 | 12/1992 | Murray et al. | 437/44 |
| 5,198,378 | 3/1993 | Rodder et al. | 437/41 |
| 5,248,893 | 9/1993 | Sakamoto | 257/409 |
| 5,342,796 | 8/1994 | Ahn et al. | 437/29 |
| 5,434,440 | 7/1995 | Yoshitomi et al. | 257/344 |
| 5,448,094 | 9/1995 | Hsu | 437/44 |

FOREIGN PATENT DOCUMENTS

| 62-296472 | 12/1987 | Japan | 437/40 RG |
| 6-112309A | 4/1994 | Japan | 437/41 RG |

Primary Examiner—Mary Wilczewski
Assistant Examiner—Brian K. Dutton
Attorney, Agent, or Firm—Morgan & Finnegan, L.L.P.

[57] ABSTRACT

A method for fabricating a metal oxide semiconductor field effect transistor, capable of achieving a reduction in topology by forming a trench on a silicon substrate by use of a temporary field oxide film and forming a gate electrode in the trench and capable of eliminating occurrence of a spiking phenomenon due to a metal wiring being in direct contact with the silicon substrate by forming a silicide film on a source and a drain, and capable of obtaining an increased contact margin of the metal wiring by overlapping the silicide film with a field oxide film formed on the silicon substrate.

6 Claims, 7 Drawing Sheets